United States Patent
Drost et al.

(10) Patent No.: US 7,148,074 B1
(45) Date of Patent: *Dec. 12, 2006

(54) METHOD AND APPARATUS FOR USING A CAPACITOR ARRAY TO MEASURE ALIGNMENT BETWEEN SYSTEM COMPONENTS

(75) Inventors: Robert J. Drost, Mountain View, CA (US); Ronald Ho, Mountain View, CA (US); Robert J. Proebsting, Sonora, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 212 days.

This patent is subject to a terminal disclaimer.

(21) Appl. No.: 10/820,662

(22) Filed: Apr. 7, 2004

Related U.S. Application Data

(63) Continuation-in-part of application No. 10/741,961, filed on Dec. 19, 2003, now Pat. No. 6,925,411.

(60) Provisional application No. 60/505,105, filed on Sep. 22, 2003.

(51) Int. Cl.
*G01R 31/26* (2006.01)
*H01L 21/66* (2006.01)

(52) U.S. Cl. .................. 438/15; 438/17; 257/E21.525; 257/E21.526

(58) Field of Classification Search .................. 438/15, 438/17; 257/E21.525, E21.526
See application file for complete search history.

(56) References Cited

U.S. PATENT DOCUMENTS 3,370,277 A * 2/1968 Van Goethem .............. 365/51
4,893,071 A * 1/1990 Miller ......................... 324/660
5,212,454 A    5/1993 Proebsting .................. 324/678
5,629,838 A    5/1997 Knight et al. ............... 361/782
6,061,508 A * 5/2000 Mehrotra et al. .............. 716/6
6,310,400 B1* 10/2001 Doyle et al. ................ 257/777
6,518,679 B1* 2/2003 Lu et al. ..................... 257/797
6,728,113 B1    4/2004 Knight et al. ............... 361/760
6,916,719 B1    7/2005 Knight et al. ............... 438/381

OTHER PUBLICATIONS

Nabors et al, IEEE Transactions on Microwave Theory and Techniques, Jul. 1992, IEEE, vol. 40, No. 7, See Abstract and Conclusions.*

* cited by examiner

*Primary Examiner*—David A. Zarneke
(74) *Attorney, Agent, or Firm*—Park, Vaughan & Fleming, LLP

(57) ABSTRACT

One embodiment of the present invention provides a system that measures alignment between a first semiconductor die and a second semiconductor die. The system operates by applying a pattern of voltage signals to a two-dimensional array of conductive transmitter elements that form a transmitter array on the first semiconductor die. This transmitter array is positioned over a corresponding two-dimensional array of conductive receiver elements that form a receiver array on the second semiconductor die, whereby a voltage signal applied to a transmitter element induces a voltage signal in one or more receiver elements. The system amplifies voltage signals induced in receiver elements in the receiver array, and subsequently analyzes the amplified signals to determine an alignment between the first semiconductor die and the second semiconductor die.

26 Claims, 7 Drawing Sheets

METHOD AND APPARATUS FOR USING A CAPACITOR ARRAY TO MEASURE ALIGNMENT BETWEEN SYSTEM COMPONENTS

RELATED APPLICATION

This application hereby claims priority under 35 U.S.C. §119 to U.S. Provisional Patent Application No. 60/505,105, filed on 22 Sep. 2003, entitled "Capacitor Array and Circuit to Measure Six Degrees of Alignment," by inventors Robert J. Drost, Ronald Ho and Robert Proebsting. This application is also a continuation-in-part of, and hereby claims priority under 35 U.S.C. § 120 to, U.S. patent application Ser. No. 10/741,961, entitled, "Method and Apparatus for Aligning Semiconductor Chips Using an Actively Driven Vernier," by inventors Robert J. Drost and Ivan E. Sutherland filed on 19 Dec. 2003 now U.S. Pat. No. 6,925,411.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to mechanisms for precisely aligning system components, such as semiconductor chips. More specifically, the present invention relates to a method and an apparatus that uses a capacitor array to measure alignment between system components.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem creates a bottleneck that continues to grow as semiconductor integration densities continue to increase.

Researchers have begun to investigate alternative techniques for communicating between semiconductor chips. One promising technique involves integrating arrays of capacitive transmitter plates and receiver plates onto semiconductor chips to facilitate inter-chip communication. If a first chip is situated face-to-face with a second chip so that transmitter plates on the first chip are capacitively coupled with receiver plates on the second chip, it becomes possible to transmit signals directly from the first chip to the second chip without having to route the signal through intervening signal lines within a printed circuit board. Other possible chip-to-chip communication techniques involve using optical fibers to couple light energy between chips, or using wire loops to couple magnetic fields between chips.

However, it is not a simple matter to align semiconductor chips with sufficient accuracy to facilitate chip-to chip communication. Conductive plates must align to couple electric fields. Optical fibers must align to couple light energy. Wire loops must align to couple magnetic fields. This alignment process must be extremely precise because these conductive plates, optical fibers and wire loops are generally a small fraction of the size of a semiconductor die, and in some cases can approach the smallest possible feature size that can be manufactured on a semiconductor substrate.

Hence, what is needed is a method and an apparatus for aligning semiconductor chips with sufficient accuracy to facilitate inter-chip communication.

SUMMARY

One embodiment of the present invention provides a system that measures alignment between a first semiconductor die and a second semiconductor die. The system operates by applying a pattern of voltage signals to a two-dimensional array of conductive transmitter elements that form a transmitter array on the first semiconductor die. This transmitter array is positioned over a corresponding two-dimensional array of conductive receiver elements that form a receiver array on the second semiconductor die, whereby a voltage signal applied to a transmitter element induces a voltage signal in one or more receiver elements. The system amplifies voltage signals induced in receiver elements in the receiver array, and subsequently analyzes the amplified signals to determine an alignment between the first semiconductor die and the second semiconductor die.

In a variation on this embodiment, transmitter elements have a different spacing than receiver elements, whereby a two-dimensional vernier alignment structure is created when the transmitter array is located over the receiver array.

In a variation on this embodiment, the transmitter array is organized as a two-dimensional n×m grid including nm conductive elements, and the receiver array includes at least three conductive elements which are not collinear.

In a variation on this embodiment, the receiver array is organized as a two-dimensional n×m grid including nm conductive elements, and the transmitter array includes at least three conductive elements which are not collinear.

In a variation on this embodiment, the system determines six degrees of alignment, including: an x alignment parallel to plane of the receiver array; a y alignment parallel to plane of the receiver array and normal to the x axis; a z alignment normal to the plane of the receiver array; an angular alignment, $\theta$, about the z axis; an angular alignment, $\Psi$, about the y axis; and an angular alignment, $\Phi$, about the x axis.

In a variation on this embodiment, the system analyzes coupling capacitances between individual receiver elements and individual transmitter elements to determine the x alignment, the y alignment and the angular alignment, $\theta$.

In a variation on this embodiment, the system analyzes the coupling capacitances by determining a nearest neighbor mapping between receiver elements and transmitter elements.

In a variation on this embodiment, the system uses a mapping function generated by a three-dimensional capacitance field solver simulation to determine the z alignment, the angular alignment, Ψ, and the angular alignment, Φ.

In a variation on this embodiment, the system determines the z alignment, the angular alignment, Ψ, and the angular alignment, Φ, by summing capacitances between individual receiver elements in the receiver array and all transmitter elements in the transmitter array, thereby effectively considering the transmitter array to be one large plate.

In a variation on this embodiment, the system determines the z alignment, the angular alignment, Ψ, and the angular alignment, Φ, by summing capacitances between individual transmitter elements in the transmitter array and all receiver elements in the receiver array, thereby effectively considering the receiver array to be one large plate.

In a variation on this embodiment, the system is configured to electrically vary the pitch of the transmitter array by grouping together adjacent transmitter elements.

In a variation on this embodiment, the system is configured to electrically vary the pitch of the receiver array by grouping together adjacent receiver elements.

In a variation on this embodiment, transmitter elements and receiver elements can be: square, rectangular, hexagonal, triangular, oval, or round.

In a variation on this embodiment, transmitter elements are located in a metal layer of the first semiconductor die and are not covered by higher layers of metal, and receiver elements are located in a metal layer of the second semiconductor die and are not covered by higher layers of metal.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Alignment Mechanism

One embodiment of the present invention includes alignment structures located on two separate parts, wherein the alignment structures facilitate a relative position measurement between the parts. In one embodiment of the present invention, each part is a separate semiconductor chip, and the alignment structures facilitate alignment of the semiconductor chips to facilitate communication between the semiconductor chips.

The alignment structure on each part includes a planar region with metal plates that form one side of a capacitor array. When the two parts are brought into close proximity to each other, mutual capacitive coupling between plates in the two structures can be measured using the known capacitance measurement techniques. (For example, see U.S. Pat. No. 5,212,454, "Method and Apparatus for Selecting and Measuring a Capacitance from a Plurality of Interconnected Capacitances," by inventor Robert J. Proebsting.) By analyzing these mutual capacitance measurements, six degrees of alignment between the two structures can determined as is described in more detail below with reference to FIGS. 1A–9C.

Figure 1A:
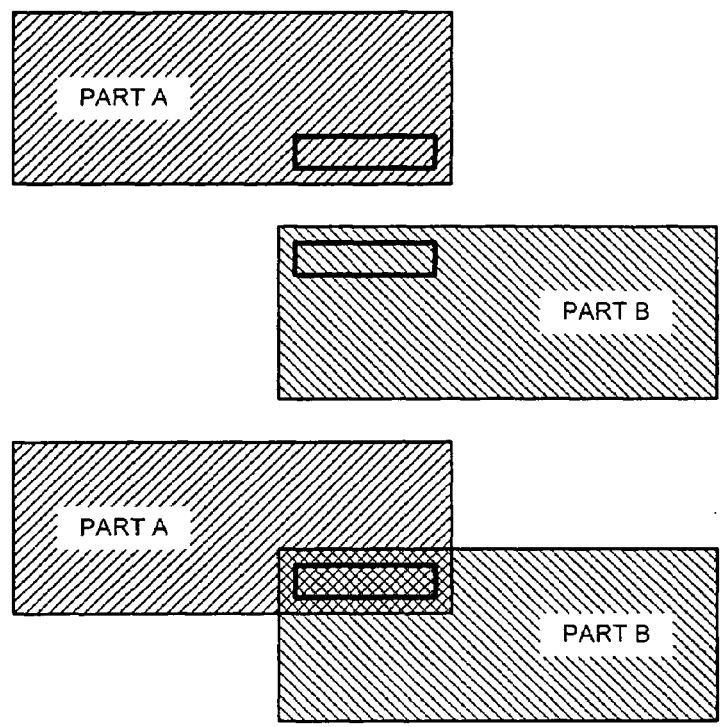
FIG. 1A illustrates how a capacitor array is used to measure alignment between two parts in accordance with an embodiment of the present invention.

More specifically, FIG. 1A illustrates parts A and B. Part A includes a planar region (indicated by a thick rectangle) that contains one side of a capacitor array structure. Note that for part A the capacitor array structure faces into the page. Similarly, part B includes a planar region (indicated by a thick rectangle) that contains the other side of the capacitor array structure. Note that for part B the capacitor array structure faces out of the page. In this way, when parts A and B are placed together the two sides of the capacitor array structure are in close proximity to each other. It is then possible to perform capacitance measurements between the capacitor arrays found on parts A and B to determine six degrees of alignment between parts A and B.

Figure 1B:
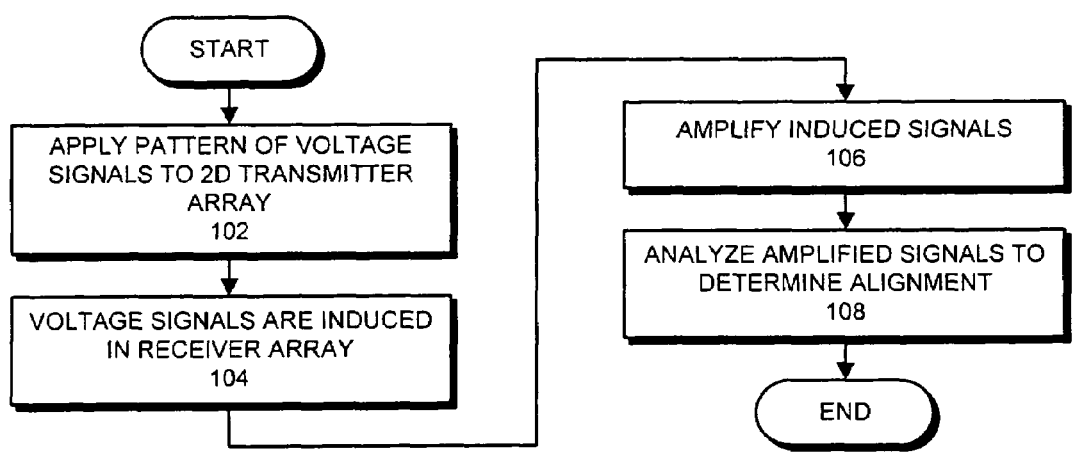
FIG. 1B presents a flow chart illustrating the process of measuring alignment between two parts in accordance with an embodiment of the present invention.

FIG. 1B presents a flow chart illustrating the process of measuring alignment between two parts A and B in accordance with an embodiment of the present invention. The process starts by applying a pattern of voltage signals to the two-dimensional transmitter array (step 102). This pattern of voltage signals induces corresponding voltage signals in conductive elements in the two-dimensional receiver array through capacitive coupling (step 104). These induced signals are amplified (step 106) and the amplified signals are subsequently analyzed (step 108) to determine the alignment between parts A and B.

Six Degrees of Alignment

Figure 2:
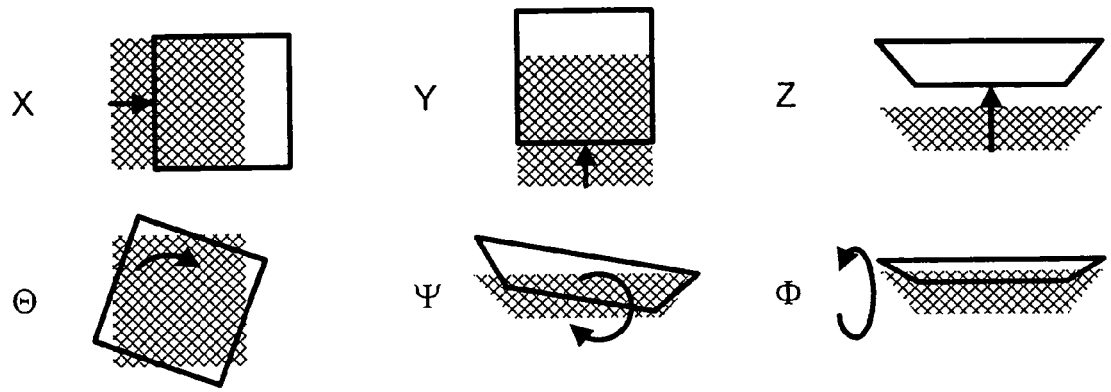
FIG. 2 illustrates six degrees of alignment in accordance with an embodiment of the present invention.

FIG. 2 illustrates six degrees of alignment between parts A and B. In one embodiment of the present invention, capacitance measurements and subsequent analysis allows x, y and θ alignments to be measured in absolute coordinates. The z, Ψ, and Φ alignments can be relatively measured and correlated to absolute values by using a mapping function generated by a three-dimensional capacitance field solver simulation.

Capacitor Array

Figure 3:
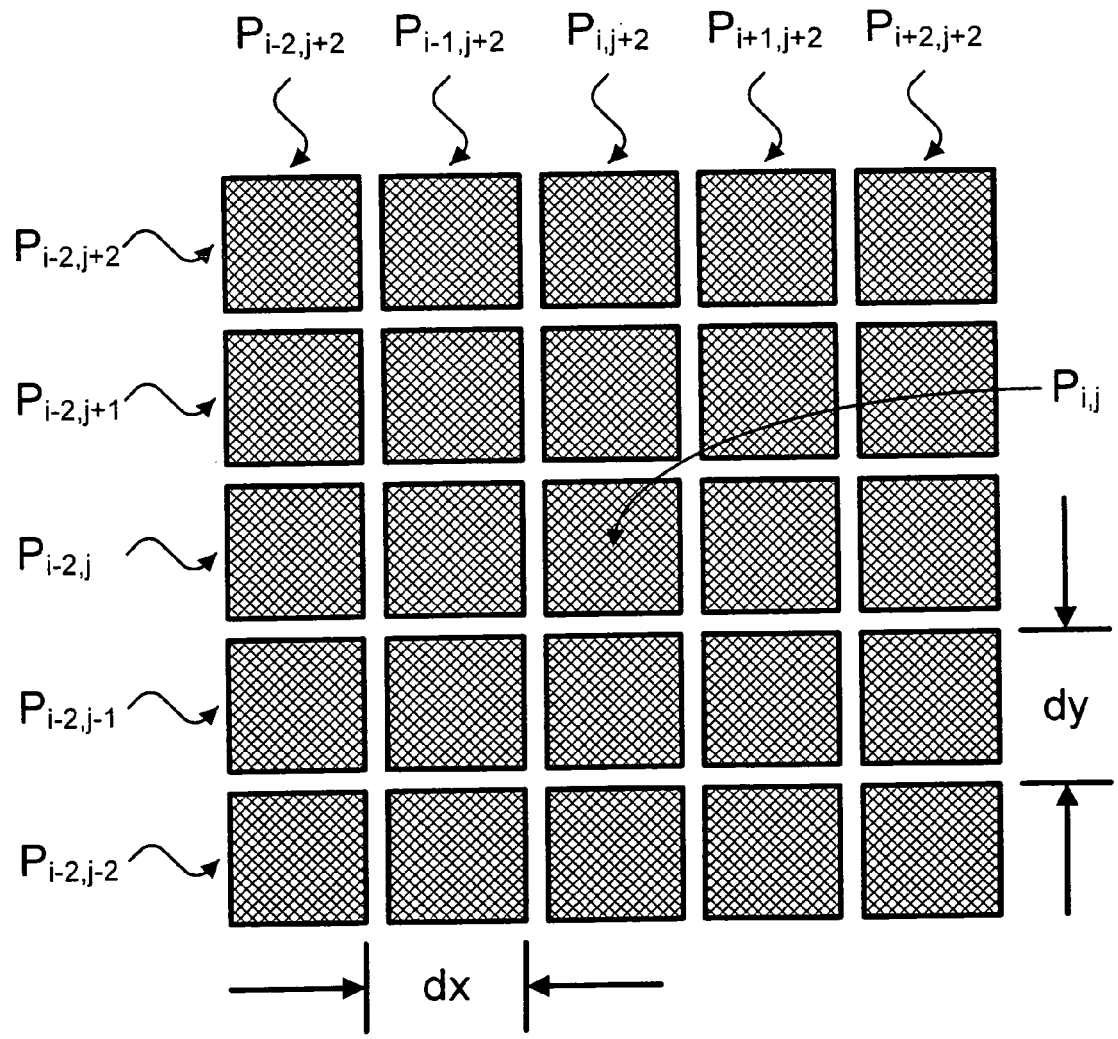
FIG. 3 illustrates a section of a capacitor array in accordance with an embodiment of the present invention.

FIG. 3 illustrates an exemplary section of a capacitor array. Note that one instance of this capacitor array is located on the transmitter and another instance is located on the receiver. The plates are labeled $P_{i,j}$, wherein the subscripts i and j specify their position in the array.

Parameters for the transmitter and receiver arrays may differ. For example, the x-pitch, dx, and/or the y-pitch, dy, may be different, or the total number of rows or columns may be different. Furthermore, the elements in the arrays can be squares, as shown, or can be other shapes such as rectangles, triangles, hexagons, circles or ovals. Note that if the transmitter and receiver arrays are located on integrated circuits, the elements of the arrays can be plates in a topmost metal layer, or in a lower metal layer that is not covered by higher metal layers.

Figure 4:
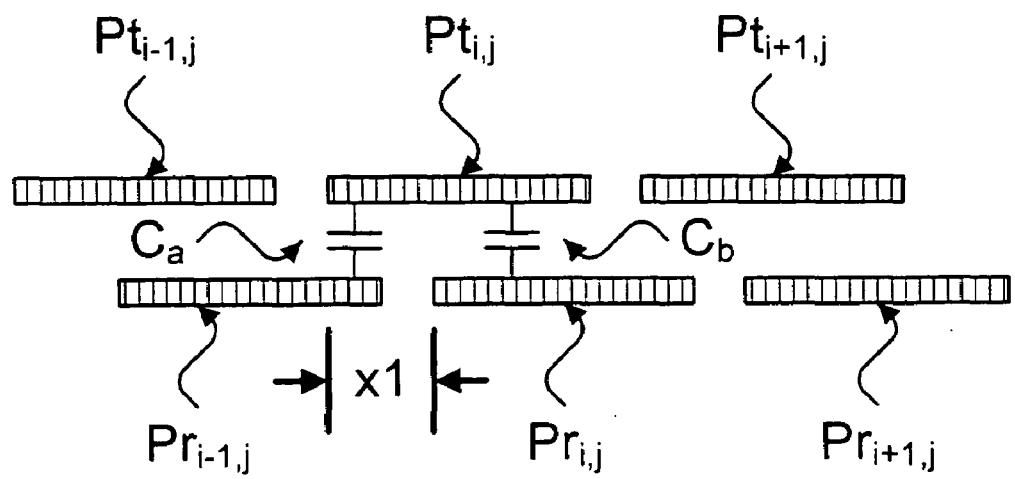
FIG. 4 illustrates mutual capacitance between transmitter and receiver plates in accordance with an embodiment of the present invention.

FIG. 4 presents a cross-sectional view of some transmitter and receiver plates. In this cross-sectional view, Pt refers to the transmitter plates, and Pr refers to the receiver plates. Note that the transmitter and receiver plates are misaligned by distance x1. As a result, some of the capacitance that was intended to couple between $Pt_{i,j}$ and $Pr_{i,j}$, illustrated as capacitor $C_b$, instead couples to $Pr_{i-1,j}$, illustrated as capacitor $C_a$. The relative size of $C_b$ and $C_a$ provides information about the misalignment distance x1. If x1 is less than half of the transmitter plate pitch, then $C_b$ will exceed $C_a$. If x1 is more than half of the transmitter plate pitch, then $C_b$ will exceed $C_a$. These capacitances can be measured using the capacitance measurement circuit and method described in U.S. Pat. No. 5,212,454.

By comparing the coupling capacitance from one receiver plate to each of the transmitter plates we can determine which transmitter plate is closest to the receiver plate. We call this closest transmitter plate the "nearest neighbor" to the receiver plate. Note that most transmitter plates have almost no coupling to most of the receiver plates. Only the transmitter plates that have some overlap area or fringe field coupling to a receiver plate will have a measurable capacitance. We can repeat this measurement for each receiver plate to obtain a mapping from all of the receiver plates to their nearest neighbors.

Two-Dimensional Vernier Pattern

Figure 5:
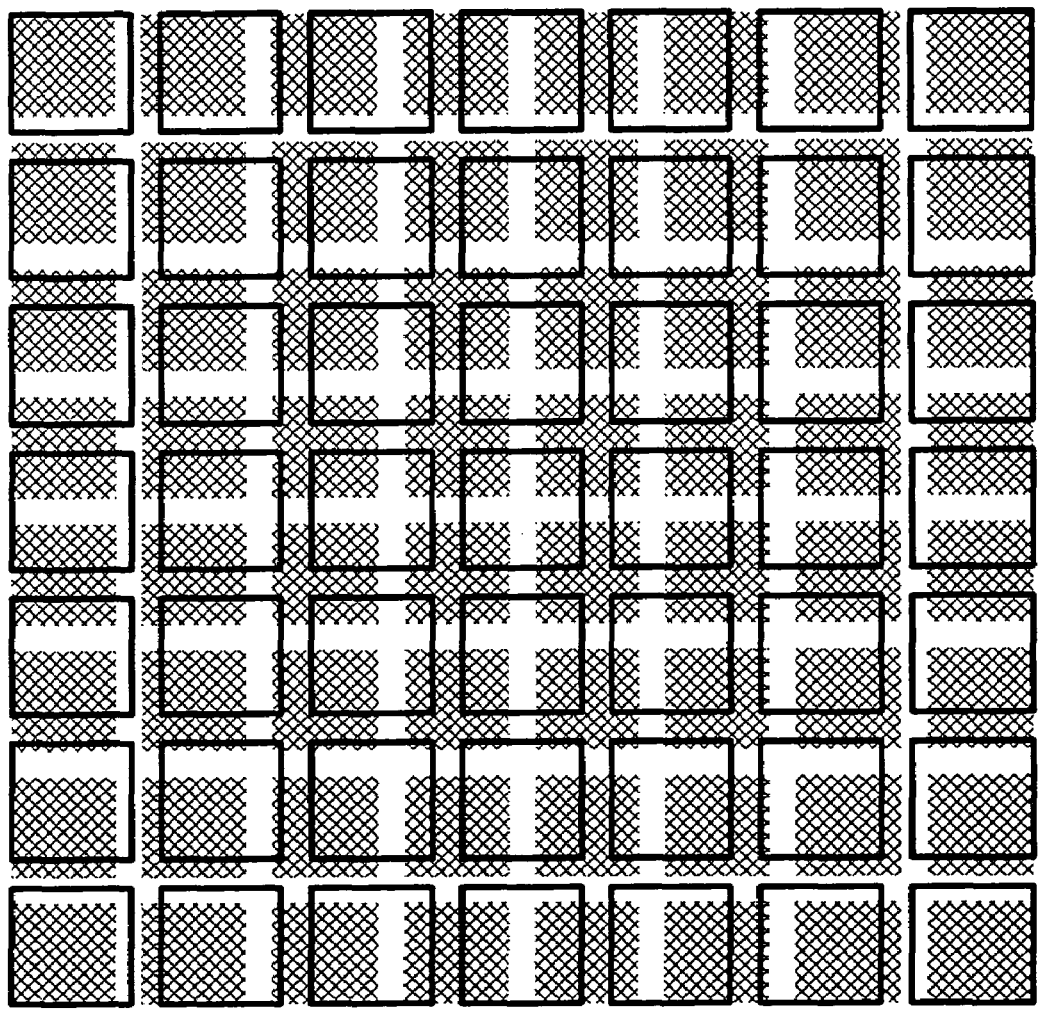
FIG. 5 illustrates a two-dimensional vernier pattern in accordance with an embodiment of the present invention.

FIG. 5 illustrates a two-dimensional Vernier pattern for a 7 by 7 array of receiver plates under a 8 by 8 array of transmitter plates. (The transmitter plates are shaded and the receiver plates are not.) Note that the transmitter and receiver plates have different pitches so that they form a two-dimensional Vernier pattern, which can be used to accurately measure both x and y offsets.

Nearest Neighbor Mapping

Figure 6:
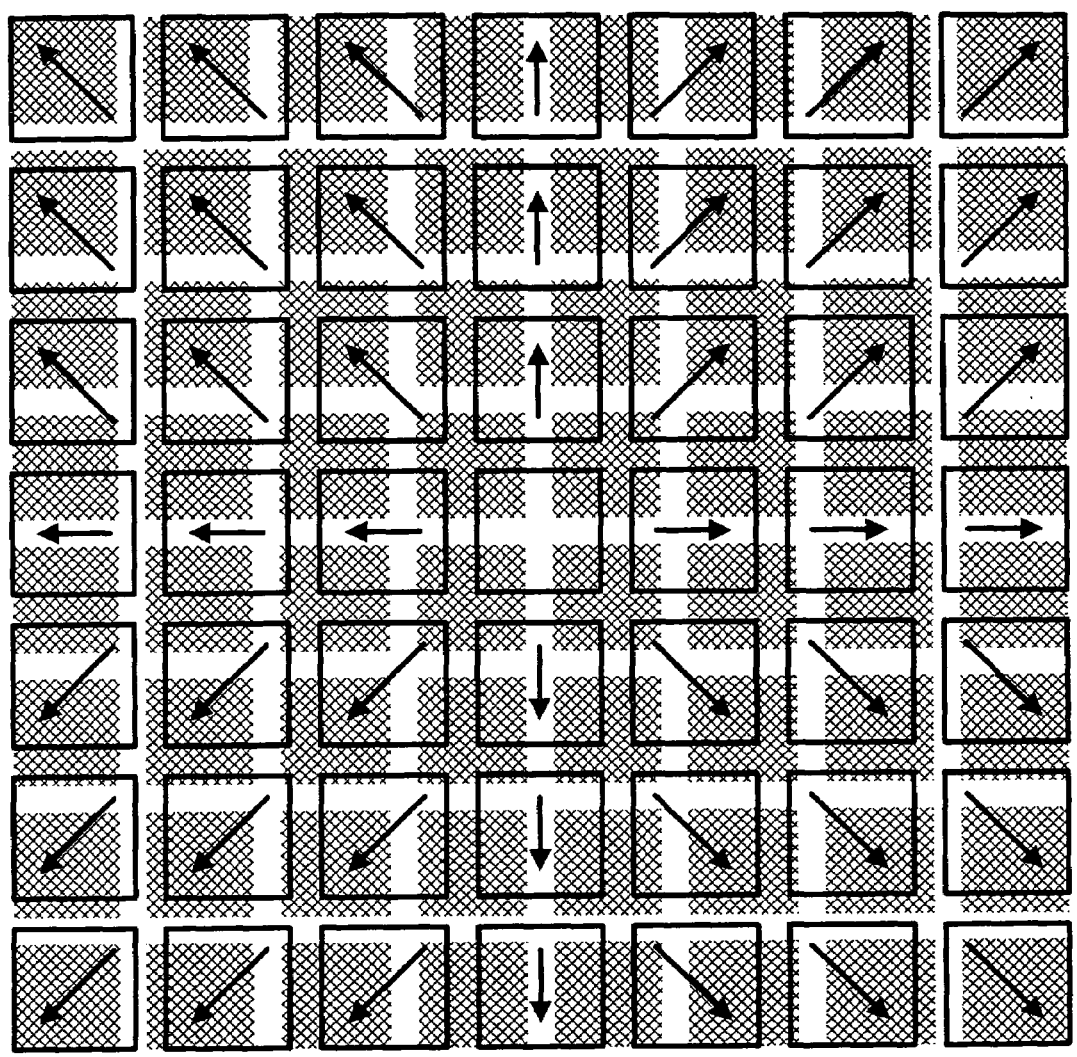
FIG. 6 illustrates a nearest neighbor mapping in accordance with an embodiment of the present invention.

FIG. 6 illustrates both transmitter and receiver plate arrays as well as arrows indicating a nearest neighbor mapping that would be made after the capacitance is measured. (The transmitter plates are shaded and the receiver plates are not.) For some receiver plates, the arrow points in a diagonal direction, indicating that the receiver plate is closest to a single diagonally offset transmitter plate. Note that the receiver plates in the middle column and row have two nearest neighbors because the capacitances to two transmitter plates are equal. For these receivers, the arrows point horizontally or vertically. For the center receiver plate, the capacitances to four transmitter plates are equal. Hence, no arrow is shown.

Figure 7:
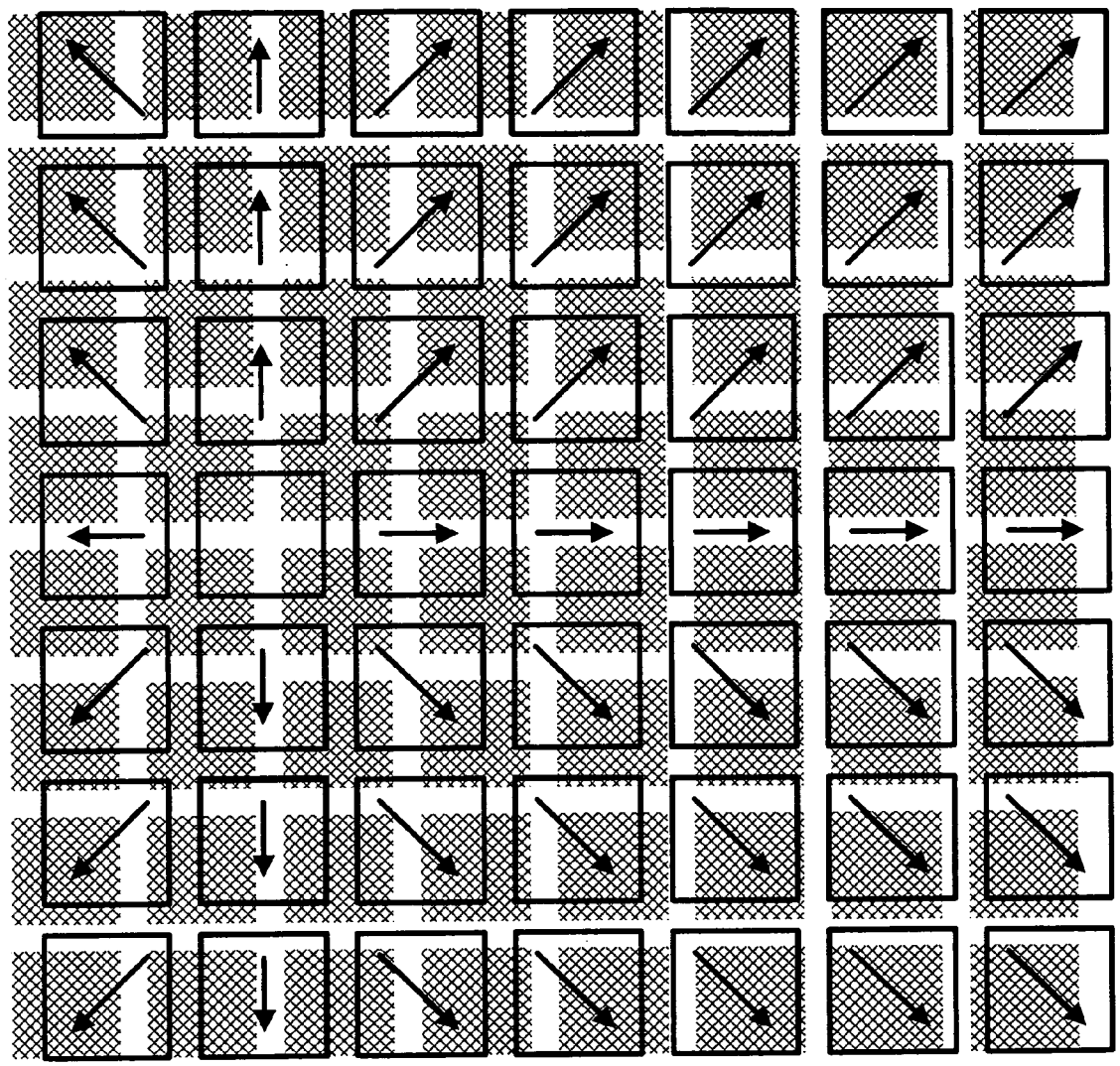
FIG. 7 illustrates a nearest neighbor mapping for translation misalignment in the x direction in accordance with an embodiment of the present invention.

FIG. 7 similarly illustrates transmitter and receiver plate arrays along with arrows indicating a nearest neighbor mapping, except that the receiver plates are shifted in the x direction. (The transmitter plates are shaded and the receiver plates are not.) Note that in FIG. 7 the nearest neighbors have changed from FIG. 6. Furthermore, note by examining these changes it is possible to determine the magnitude of the misalignment.

Rotational Alignment

Figure 8:
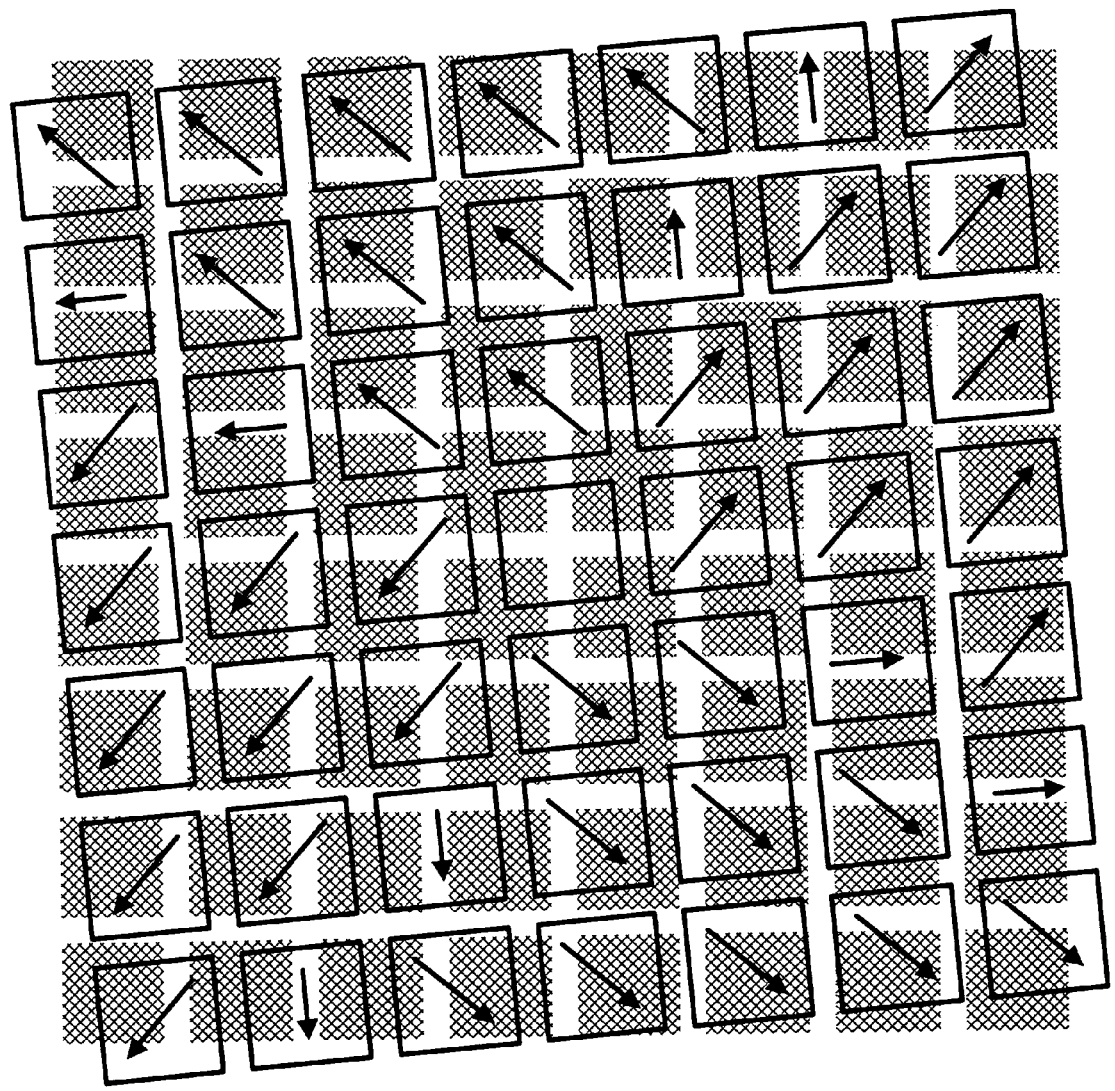
FIG. 8 illustrates a nearest neighbor mapping for rotational misalignment in accordance with an embodiment of the present invention.

FIG. 8 similarly illustrates a nearest neighbor mapping, except that the receiver plate array is rotated by five degrees relative to the transmitter plate array. Again, the mapping changes as a function of the misalignment between the transmitter and receiver arrays.

For z-measurements and tilts in $\Psi$ and $\Phi$ between the plate arrays we can sum the capacitance measurements between a single receiver plate and all transmitter plates rather than measuring individual mutual capacitance between transmitter and receiver plates. This summation can be performed after individual plate to plate mutual capacitances are measured, or alternatively, a number of transmitter plates can be connected together during the analog capacitance measurement so that one measurement measures the total capacitance. (Alternatively, note that we can similarly sum capacitance measurements between a single transmitter plate and all receiver plates.)

Summing capacitances between the receiver plate and all the transmitter plates (or, alternatively between the transmitter plate and all the receiver plates) causes the transmitter plates to act as one large plate. In this mode, x or y shifts and θ rotations have little effect on the measured capacitance because a plane of small tightly-packed plates acts similarly to a solid plane in terms of capacitive coupling.

For the z distance, and $\Psi$ and $\Phi$ tilt measurements, the measured capacitances can be correlated to distance or tilt through a mapping function created using a three-dimensional field solver. For each receiver plate, we can correlate the capacitance to a distance. Across the entire array of receiver plates, the average z-distance can be used as the distance between the receiver and transmitter plate arrays. The tilts in $\Psi$ and $\Phi$ can be determined based on the change or slope in the z distance as a function of x and y position.

Variations

Figure 9A:
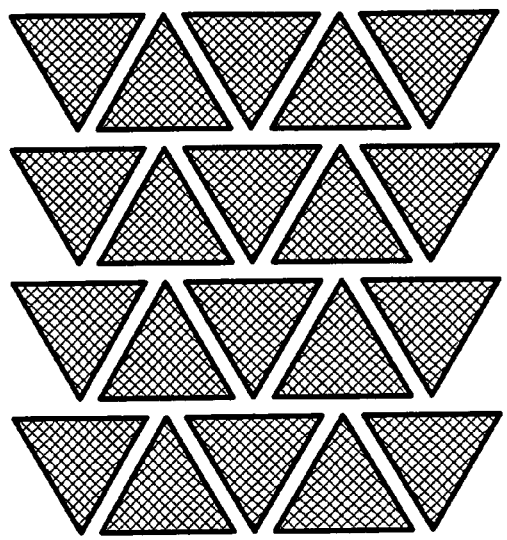
FIG. 9A illustrates a triangular plate arrangement in accordance with an embodiment of the present invention.
Figure 9B:
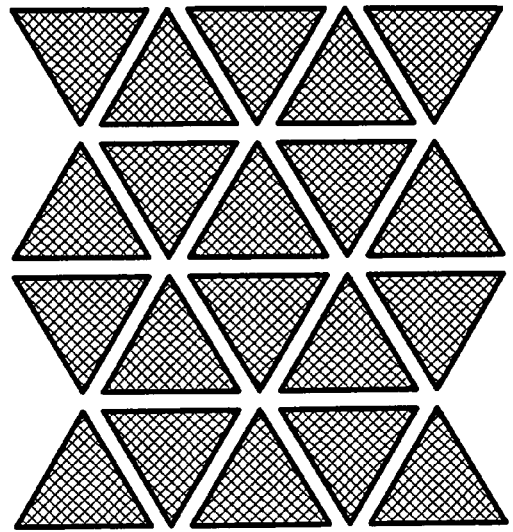
FIG. 9B illustrates another triangular plate arrangement in accordance with an embodiment of the present invention.
Figure 9C:
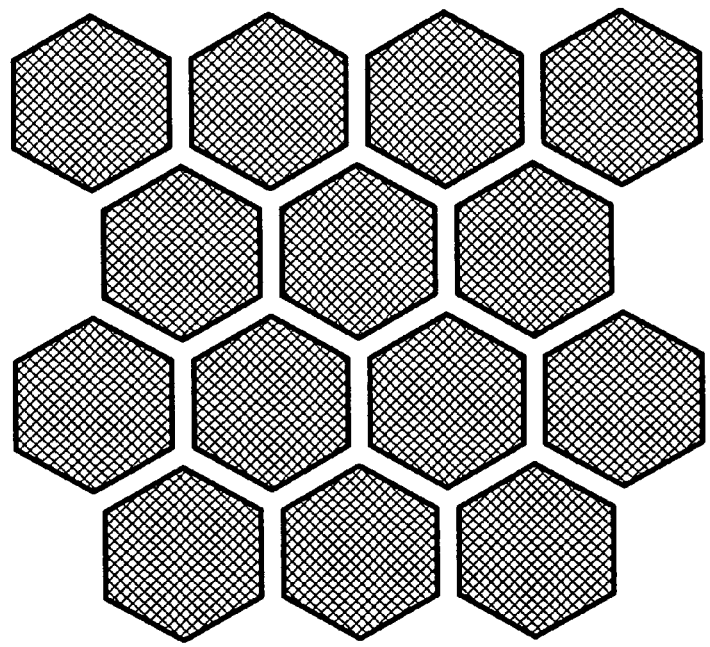
FIG. 9C illustrates a hexagonal plate arrangement in accordance with an embodiment of the present invention.

Note that pitch can be varied along x and y dimensions if alignment is more critical in one dimension. Pitch can also be electrically varied by grouping together sets of transmitter or receiver plates. For faster testing, groups of transmitter plates and receiver plates can be ganged together, for example in a 2 by 2 or a 4 by 4 arrangement. In this case, measurements will take fewer steps but will be less accurate. Furthermore, plates can be shapes other than rectangles. For instance, the transmitter and receiver arrays could be arrays of triangles or hexagons as are illustrated in FIGS. 9A–9C.

We can also connect transmitter plates into vertical bars for x measurements, and into horizontal bars for y measurements. Two or more measurement arrays can be separated by some distance in order to increase the sensitivity in measuring θ, $\Psi$, or $\Phi$ misalignments. For these misalignments measurements, increasing the maximum span of the measurement structure improves the measurement sensitivity.

Plates in the array can also have two or more physical pitches. This can provide variable resolution to the measurement, thereby easing initial alignment using a large pitch, but improving final alignment accuracy using a fine pitch.

Also note that it is not necessary to use a complete n by m array of transmitter plates and a complete n by m array of receiver plates. In fact, if an n by m array of transmitter plates is used, it is possible to determine six degrees of alignment using only three receiver plates, as long as the receiver plates are not colinear. Similarly if an n by m array of receiver plates is used, it is possible to determine six degrees of alignment using only three transmitter plates, as long as the transmitter plates are not colinear.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for measuring alignment between a first semiconductor die and a second semiconductor die, comprising:
    applying a pattern of voltage signals to a two-dimensional array of conductive transmitter elements that form a transmitter array on the first semiconductor die;
    wherein the transmitter array on the first semiconductor die is located over a corresponding two-dimensional array of conductive receiver elements that form a receiver array on the second semiconductor die;
    wherein transmitter elements have a different spacing than receiver elements, whereby a two-dimensional vernier alignment structure is created when the transmitter array is located over the receiver array;
    wherein a voltage signal applied to a transmitter element induces a voltage signal in one or more receiver elements;
    amplifying voltage signals induced in receiver elements in the receiver array; and
    analyzing the amplified signals to determine an alignment between the first semiconductor die and the second semiconductor die.

2. The method of claim 1,
    wherein the transmitter array is organized as a two-dimensional n×m grid including nm conductive elements; and
    wherein the receiver array includes at least three conductive elements which are not collinear.

3. The method of claim 1,
    wherein the receiver array is organized as a two-dimensional n×m grid including nm conductive elements; and
    wherein the transmitter array includes at least three conductive elements which are not collinear.

4. The method of claim 1, wherein determining the alignment involves determining six degrees of alignment, including:
    an x alignment parallel to plane of the receiver array;
    a y alignment parallel to plane of the receiver array and normal to the x axis;
    a z alignment normal to the plane of the receiver array;
    an angular alignment, $\theta$, about the z axis;
    an angular alignment, $\Psi$, about the y axis; and
    an angular alignment, $\Phi$, about the x axis.

5. The method of claim 4, wherein determining the alignment involves analyzing coupling capacitances between individual receiver elements and individual transmitter elements to determine the x alignment, they alignment and the angular alignment, $\theta$.

6. The method of claim 5, wherein analyzing the coupling capacitances involves determining a nearest neighbor mapping between receiver elements and transmitter elements.

7. The method of claim 4, wherein determining the alignment involves using a mapping function generated by a three-dimensional capacitance field solver simulation to determine the z alignment, the angular alignment, $\Psi$, and the angular alignment, $\Phi$.

8. The method of claim 4, wherein determining the z alignment, the angular alignment, $\Psi$, and the angular alignment, $\Phi$, involves summing capacitances between individual receiver elements in the receiver array and all transmitter elements in the transmitter array, thereby effectively considering the transmitter array to be one large plate.

9. The method of claim 4, wherein determining the z alignment, the angular alignment, $\Psi$, and the angular alignment, $\Phi$, involves summing capacitances between individual transmitter elements in the transmitter array and all receiver elements in the receiver array, thereby effectively considering the receiver array to be one large plate.

10. The method of claim 1, further comprising electrically varying the pitch of the transmitter array by grouping together adjacent transmitter elements.

11. The method of claim 1, further comprising electrically varying the pitch of the receiver array by grouping together adjacent receiver elements.

12. The method of claim 1, wherein transmitter elements and receiver elements are:
    square;
    rectangular;
    hexagonal;
    triangular;
    oval; or
    round.

13. The method of claim 1,
    wherein transmitter elements are located in a metal layer of the first semiconductor die and are not covered by higher layers of metal; and
    wherein receiver elements are located in a metal layer of the second semiconductor die and are not covered by higher layers of metal.

14. An apparatus that measures alignment between a first semiconductor die and a second semiconductor die, comprising:
    a two-dimensional array of conductive transmitter elements that form a transmitter array on the first semiconductor die;
    a two-dimensional array of conductive receiver elements that form a receiver array on the second semiconductor die;
    wherein transmitter elements have a different spacing than receiver elements, whereby a two-dimensional vernier alignment structure is created when the transmitter array is located over the receiver array;
    a driving mechanism configured to apply a pattern of voltage signals to the transmitter array;
    wherein a voltage signal applied to a transmitter element induces a voltage signal in one or more receiver elements when the transmitter array is located over the receiver array;
    an amplification mechanism configured to amplify voltage signals induced in receiver elements in the receiver array; and
    an analysis mechanism configured to analyze the amplified signals to determine an alignment between the first semiconductor die and the second semiconductor die.

15. The apparatus of claim 14,
    wherein the transmitter array is organized as a two-dimensional n×m grid including nm conductive elements; and
    wherein the receiver array includes at least three conductive elements which are not collinear.

16. The apparatus of claim 14,
wherein the receiver array is organized as a two-dimensional n×m grid including nm conductive elements; and
wherein the transmitter array includes at least three conductive elements which are not collinear.

17. The apparatus of claim 14, wherein the driving mechanism and the analysis mechanism are configured to determine six degrees of alignment, including:
an x alignment parallel to plane of the receiver array;
a y alignment parallel to plane of the receiver array and normal to the x axis;
a z alignment normal to the plane of the receiver array;
an angular alignment, $\theta$, about the z axis;
an angular alignment, $\Psi$, about the y axis; and
an angular alignment, $\Phi$, about the x axis.

18. The apparatus of claim 17, wherein the analysis mechanism is configured to determine coupling capacitances between individual receiver elements and individual transmitter elements to determine the x alignment, the y alignment and the angular alignment, $\theta$.

19. The apparatus of claim 18, wherein the analysis mechanism is configured to determine a nearest neighbor mapping between receiver elements and transmitter elements.

20. The apparatus of claim 17, wherein the analysis mechanism is configured to use a mapping function generated by a three-dimensional capacitance field solver simulation to determine the z alignment, the angular alignment, $\Psi$, and the angular alignment, $\Phi$.

21. The apparatus of claim 17, wherein the apparatus is configured to determine the z alignment, the angular alignment, $\Psi$, and the angular alignment, $\Phi$, by summing capacitances between individual receiver elements in the receiver array and all transmitter elements in the transmitter array, thereby effectively considering the transmitter array to be one large plate.

22. The apparatus of claim 17, wherein the apparatus is configured to determine the z alignment, the angular alignment, $\Psi$, and the angular alignment, $\Phi$, by summing capacitances between individual transmitter elements in the transmitter array and all receiver elements in the receiver array, thereby effectively considering the receiver array to be one large plate.

23. The apparatus of claim 14, wherein the apparatus is configured to electrically vary the pitch of the transmitter array by grouping together adjacent transmitter elements.

24. The apparatus of claim 14, wherein the apparatus is configured to electrically vary the pitch of the receiver array by grouping together adjacent receiver elements.

25. The apparatus of claim 14, wherein transmitter elements and receiver elements are:
square;
rectangular;
hexagonal;
triangular;
oval; or
round.

26. The apparatus of claim 14,
wherein transmitter elements are located in a metal layer of the first semiconductor die and are not covered by higher layers of metal; and
wherein receiver elements are located in a metal layer of the second semiconductor die and are not covered by higher layers of metal.

* * * * *

UNITED STATES PATENT AND TRADEMARK OFFICE
CERTIFICATE OF CORRECTION

| | | |
|---|---|---|
| PATENT NO. | : 7,148,074 B1 | Page 1 of 1 |
| APPLICATION NO. | : 10/820662 | |
| DATED | : December 12, 2006 | |
| INVENTOR(S) | : Robert J. Drost et al. | |

It is certified that error appears in the above-identified patent and that said Letters Patent is hereby corrected as shown below:

In claim 5 (at column 7, line 61), please delete the words, "they alignment" and replace with the words --the y alignment--.

In claim 17 (at column 9, line 14), please delete the words, "they alignment" and replace with the words --the y alignment--.

Signed and Sealed this

Twenty-seventh Day of February, 2007

JON W. DUDAS
*Director of the United States Patent and Trademark Office*